United States Patent
Hansen et al.

(10) Patent No.: US 7,421,677 B2
(45) Date of Patent: Sep. 2, 2008

(54) ILLUMINATOR CONTROLLED TONE REVERSAL PRINTING

(75) Inventors: Steven G. Hansen, Phoenix, AZ (US); Doug Van Den Broeke, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 14 days.

(21) Appl. No.: 10/986,118

(22) Filed: Nov. 12, 2004

(65) Prior Publication Data
US 2005/0094121 A1    May 5, 2005

Related U.S. Application Data

(63) Continuation of application No. 10/417,342, filed on Apr. 17, 2003, now abandoned.

(51) Int. Cl.
    *G06F 17/50* (2006.01)
(52) U.S. Cl. .......................... 716/21; 716/19
(58) Field of Classification Search ............. 716/19–21, 716/3
    See application file for complete search history.

(56) References Cited

U.S. PATENT DOCUMENTS

| | | | |
|---|---|---|---|
| 4,104,070 A | 8/1978 | Moritz et al. | |
| 4,973,544 A | 11/1990 | Slayman et al. | |
| 5,459,013 A | 10/1995 | Berry et al. | |
| 5,638,211 A | 6/1997 | Shiraishi | |
| 5,948,574 A | 9/1999 | Okamoto | |
| 6,042,998 A * | 3/2000 | Brueck et al. | 430/316 |
| 6,115,108 A | 9/2000 | Capodieci | |
| 6,233,041 B1 | 5/2001 | Shiraishi | |
| 6,233,044 B1 * | 5/2001 | Brueck et al. | 355/67 |
| 6,335,130 B1 | 1/2002 | Chen et al. | |
| 6,452,662 B2 | 9/2002 | Mulkens et al. | |
| 2001/0003034 A1 * | 6/2001 | Furukawa et al. | 430/313 |
| 2001/0046038 A1 * | 11/2001 | Mulkens et al. | 355/67 |
| 2002/0001758 A1 * | 1/2002 | Petersen et al. | 430/5 |
| 2002/0076654 A1 * | 6/2002 | Hasegawa et al. | 430/311 |
| 2002/0086218 A1 * | 7/2002 | Tejnil | 430/5 |
| 2002/0102469 A1 * | 8/2002 | Dulman et al. | 430/5 |
| 2003/0156266 A1 * | 8/2003 | Tanitsu | 355/67 |
| 2003/0170565 A1 * | 9/2003 | Eurlings et al. | 430/270.11 |
| 2005/0206865 A1 * | 9/2005 | Kwan et al. | 355/53 |

* cited by examiner

*Primary Examiner*—Jack Chiang
*Assistant Examiner*—Suresh Memula
(74) *Attorney, Agent, or Firm*—Pillsbury Winthrop Shaw Pittman, LLP

(57) ABSTRACT

A method of reversing the tone of an image to be printed in a layer of radiation sensitive material formed on a substrate includes defining a lithographic problem, designing a patterning device, determining a first illumination arrangement and a radiation sensitive material process capable of printing a positive tone of the lithographic feature; and determining a second illumination arrangement capable of printing a negative tone of the lithographic feature with the radiation sensitive material process.

12 Claims, 14 Drawing Sheets

ILLUMINATOR CONTROLLED TONE REVERSAL PRINTING

This application is a continuation of U.S. application Ser. No. 10/417,342, filed Apr. 17, 2003 now abandoned, the entire contents of which are incorporated herein by reference.

BACKGROUND OF THE INVENTION

1. Field of the Invention

The present invention relates to a method of reversing the tone of an image to be printed in a layer of radiation sensitive material formed on a substrate by controlling an illumination system adapted to produce multipole, small sigma and annular illumination arrangements.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to keep pace with Moore's law and develop features having subwavelength resolution, it has become necessary to use a variety of resolution enhancement techniques (RET). The resolution limit of photolithographic techniques using a reduction exposure method is $R=k_1 \lambda/(NA)$, where R is the resolution limit in nanometers (nm), $k_1$ is a constant dependent on the type of resist used, $\lambda$ is the wavelength of the exposure radiation (nm), and NA is the numerical aperture of the lens.

The resolution limit of currently available lithographic techniques is being reached due to a decrease in the depth of focus, difficulty in the design of lenses and complexities in the lens fabrication technology. A lower limit on the value of the constant $k_1$ is approximately 0.25.

Currently available RET include optical proximity correction (OPC) of optical proximity errors (OPE), phase shifting masks (PSM), sub-resolution assist features (SRAF), and off-axis illumination (OAI). Each technique may be used alone, or in combination with other techniques.

When pattern dimensions approach the Rayleigh limit, the projected image is no longer a faithful reproduction of the mask pattern shaped. Optical proximity effects, such as corner rounding, line-end shortening, and line width errors are common problems in sub-resolution lithography. OPC techniques are used to pre-distort the mask pattern so that the shape of the projected image takes on a desired shape. Currently used OPC techniques include line-end treatments, for example serifs and hammerheads, that stretch out the ends of lines on the mask so that the final imaged lines have the desired length and sharpened corners. Line biasing adjusts the width of lines on the mask to compensate for variations of line width across pitch. Scattering bars are sub-resolution features that are placed alongside isolated or semi-isolated lines to help the lines behave more like dense lines, even through focus.

Phase shifting masks alter the phase of radiation passing through different portions of the mask, thus reducing diffraction effects by combining diffracted radiation and phase shifted diffracted radiation so that constructive and destructive interference takes places favorably, which increases contrast and improves resolution. Attenuated phase shift masks, chromeless phase shift lithography masks, and alternating phase shift masks are currently used to improve resolution of lithographic projection apparatus.

Sub-resolution assist features are added to masks in proximity to pattern features to improve resistance to process variations. The assist features image but do not print on the wafer. Assist features require a minimum amount of space to be effective, thus limiting their use in dense patterns.

Various illumination techniques, including off-axis illumination, may be used to improve resolution. Off-axis illumination improves resolution by illuminating the mask with radiation that is at an angle to the optical axis of the lens. The incidence of the radiation on the mask, which acts as a diffraction grating, improves the contrast of the image by transmitting more of the diffracted orders through the lens. Off-axis illumination techniques used with conventional masks produce resolution enhancement effects similar to resolution enhancement effects obtained with phase shifting masks.

Referring to FIGS. 2-5, currently available illumination intensity distributions or arrangements include small, or low, sigma (FIG. 2), annular (FIG. 3), quadrupole (FIG. 4), and quasar (FIG. 5), with the illuminated areas shown in cross section. The annular, quadrupole and quasar illumination techniques of FIGS. 3-5 are examples of off-axis illumination schemes. A lithographic apparatus capable of producing each off-axis illumination scheme shown in FIGS. 3-5 is disclosed in U.S. Pat. No. 6,452,662, incorporated herein by reference in its entirety.

Small sigma illumination is incident on the mask with approximately zero illumination angle (i.e. almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and quasar illumination are incident on the mask with four main angles and provide improved resolution and increased depth of focus while being strongly pattern dependent.

Referring to FIGS. 6 and 7, two conventional illumination systems IL are schematically illustrated. The systems illustrated in FIGS. 6 and 7 include light collecting/collimating optics 10; an axicon/zoom module 12; and light integrating and projecting optics 14. The illumination systems IL define an optical axis 16, a pupil plane 18, and a mask plane 20. The axicon/zoom module 12 comprises a pair of axicons 22, one concave and one convex, whose separation can be varied. The module 12 also comprises a zoom lens 24.

For the case of conical axicons, some examples of the illumination intensity distributions achievable at the pupil plane 18 are shown in FIG. 8. The spot size can be varied between states A and B by changing the zoom lens position. Similarly, the annularity can be changed between states A and C by varying the axicon opening (separation between the axicons).

To improve the illumination homogeneity, an optical integrator 26 is used. In FIG. 6 the optical integrator takes the form of a light pipe 26, such as a glass, calcium fluoride or quartz rod. A coupler 28 couples the illumination at the pupil plane 18 into the rod 26, and rod exit imaging optics 30 are also provided. In FIG. 7 a fly's eye element 32 acts as the integrator. The fly's eye element 32 is a composite lens comprising an array or honeycomb of small lenses. Further objective lenses 34, 36 complete the projection optics.

Resists are used to create positive and negative images of a desired pattern. A positive resist is one which becomes soluble after exposure to a specified dose of radiation. The pattern is formed in the resist by exposure and then developed, or removed, by a solvent, or an acid or base solution. After removal of the soluble resist, the exposed portion of the wafer is then etched and the etched pattern is filled with material, for example metal, to form the device. The remaining resist is then stripped to complete manufacture of the device.

Negative resists becomes insoluble after exposure to a dose of radiation. The solvent removes the unexposed (soluble) resist and leaves the exposed (insoluble) resist on the wafer in the shape of the desired pattern.

It is possible to print negative images by performing image reversal of positive resist. Such a process is disclosed, for example, in U.S. Pat. No. 4,104,070. The process generally includes coating a substrate or wafer with positive resist, pre-exposure soft baking the coated wafer, exposing the coated wafer to a patterned source of radiation, post-exposure baking the coated wafer at a temperature higher than the pre-exposure soft bake to cross link the exposed resist, flood exposing the coated wafer to make the previously unexposed resist dissolvable in the developer, and developing the resist.

Image reversal provides all of the advantages of positive resist, including improved resolution, superior edge quality, safer and more reliable processing with aqueous-based developers instead of flammable organic developers, and superior critical dimension (CD) control and uniformity. The image reversal process includes several disadvantages, however. The catalysts added to positive resists are not stable and must be prepared immediately before exposure. The catalysts added to the positive resist may also contaminate the resist and increase defect densities. The image reversal process also requires between two and three times the exposure dose of standard positive resist processing. The processes have not been extensively used or sufficiently developed for use in modern lithographic problems.

Negative imaging is used in the production of printed wiring boards. Negative imaging is also used in the production of III-V devices, such as those with GaAs substrates, for telecommunication device fabrication. A lift-off process is used in the fabrication of III-V devices due to the incompatibility of the substrate with etchable metals, such as Al, Au, Ni, Pt, Ta, and Ti. In the lift-off process a negative image is formed in a sacrificial resist layer deposited on a substrate, a metal film is deposited over the sacrificial resist layer and in the openings of the pattern on the substrate, and the portions of the metal film deposited on the sacrificial resist layer are removed (i.e. lifted-off) when the substrate is immersed in a solvent. The metal deposited through the openings of the pattern on the substrate is left behind in the desired pattern.

Negative imaging is also used in the production of lithographically defined, magnetic nanoparticles, or nanomagnets, for continuous magnetic data storage media having ultrahigh data density storage. Negative imaging is preferred to form the dimensions of holes patterned between neighboring magnetic pillars. Negative imaging yields three times the contrast of positive imaging for the generation of holes in resist, thus providing an enhanced process latitude for patterning gratings in which the lines are wider than the spaces. Currently available techniques permit creation of large area arrays of nanomagnets with dimensions in the 100 nm range, using either electroplating or lift-off processes.

SUMMARY OF THE INVENTION

It is an aspect of the present invention to provide a method of performing image tone reversal by controlling an illuminator adapted to produce multipole illumination arrangements.

This and other aspects are achieved according to the invention by a method of reversing a tone of an image to be printed in a layer of radiation sensitive material formed on a substrate, the method including defining a lithographic problem, the problem including a lithographic feature to be printed; designing a patterning device; determining a first illumination arrangement and a radiation sensitive material process capable of printing a positive tone of the lithographic feature; and determining a second illumination arrangement capable of negatively printing the lithographic feature with the radiation sensitive material process.

According to a further aspect of the invention there is provided a method of reversing a tone of an image to be printed in a layer of radiation sensitive material formed on a substrate using an illumination pattern generated by an illumination system including a plurality of optical elements along an optical axis, the method including defining a lithographic problem, the problem including a lithographic feature to be printed; designing a patterning device; determining a first illumination arrangement and a radiation sensitive material process capable of printing a positive tone of the lithographic feature; and determining a second illumination arrangement capable of printing a negative tone of the lithographic feature with the radiation sensitive material process.

According to a still further aspect of the invention, there is provided a device for use in integrated circuits, integrated optical systems, patterns for magnetic domain memories, liquid-crystal display panels, thin-film magnetic heads, printed wiring boards, and nanomagnet fabrications, the device manufactured by a method including defining a lithographic problem, the problem including a lithographic feature to be printed; designing a patterning device; determining a first illumination arrangement and a radiation sensitive material process capable of printing a positive tone of the lithographic feature; providing a substrate at least partially covered by a layer of radiation sensitive material; determining a second illumination arrangement capable of printing a negative tone of the lithographic feature with the radiation sensitive material process; projecting the projection beam, having the first or second illumination arrangement and endowed with the pattern in its cross section using the patterning device, onto a target portion of the layer of substrate.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 10b is a schematic illustration of an illumination arrangement obtained with the multipole generating element of FIG. 10a;

In the Figures, corresponding reference symbols indicate corresponding parts.

DETAILED DESCRIPTION

Figure 1:
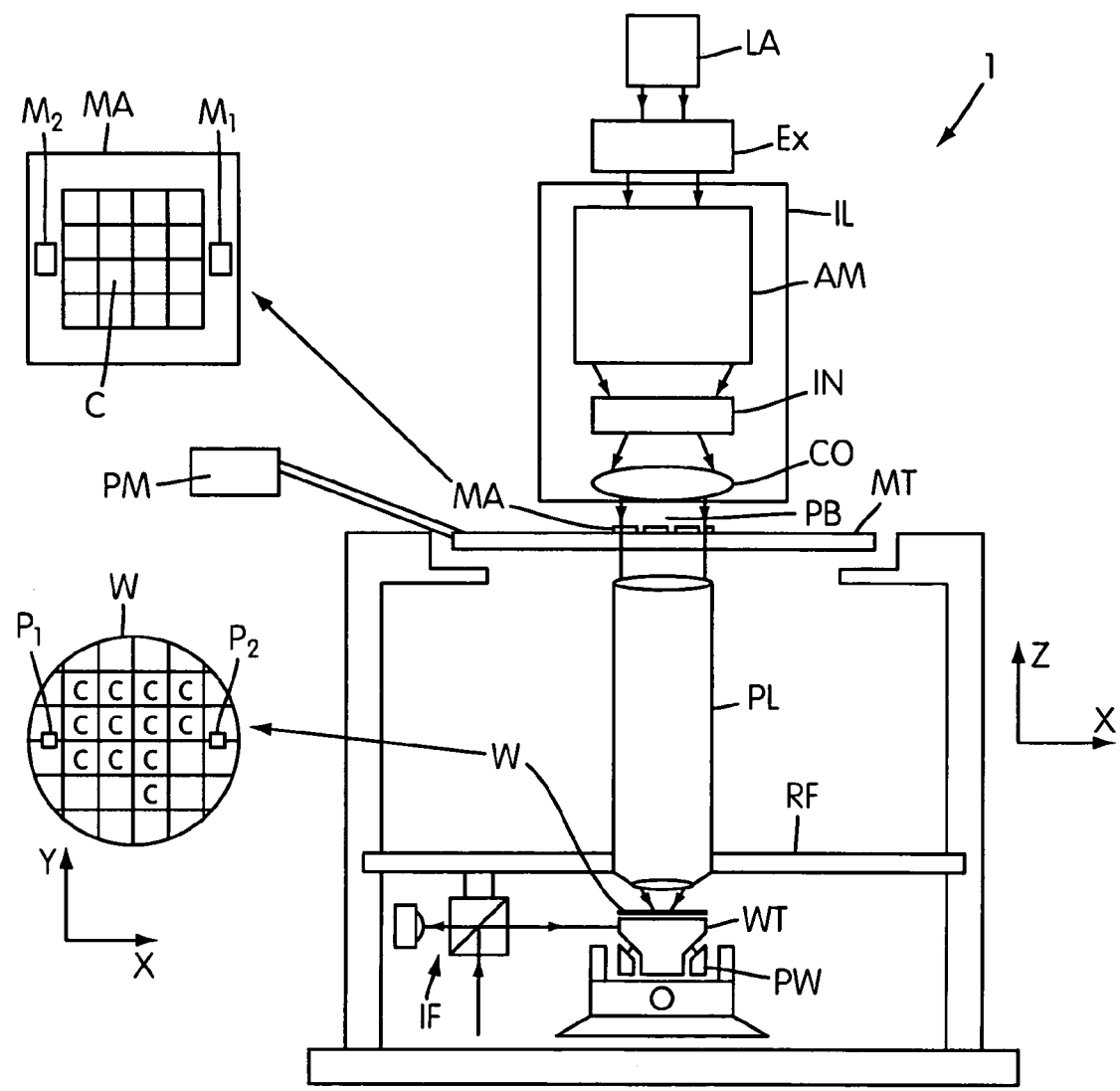
FIG. 1 is a schematic illustration of a lithographic projection apparatus.

FIG. 1 schematically depicts a lithographic projection apparatus 1 according to an embodiment of the invention. The apparatus includes a radiation system Ex, IL that supplies a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object table (mask table) MT provided with a mask holder for holding a mask MA (e.g. a reticle), and connected to a first positioning device PM to accurately position the mask with respect to a projection system PL; a second object table (substrate table) WT provided with a substrate holder for holding a substrate W (e.g. a resist-coated silicon wafer), and connected to a second positioning device PW to accurately position the substrate with respect to the projection system PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The current invention encompasses both of these scenarios. In particular, the current invention and claims encompass embodiments wherein the radiation system Ex, IL is adapted to supply a projection beam of radiation having a wavelength of, for example, 248 nm and 193 nm, preferably less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
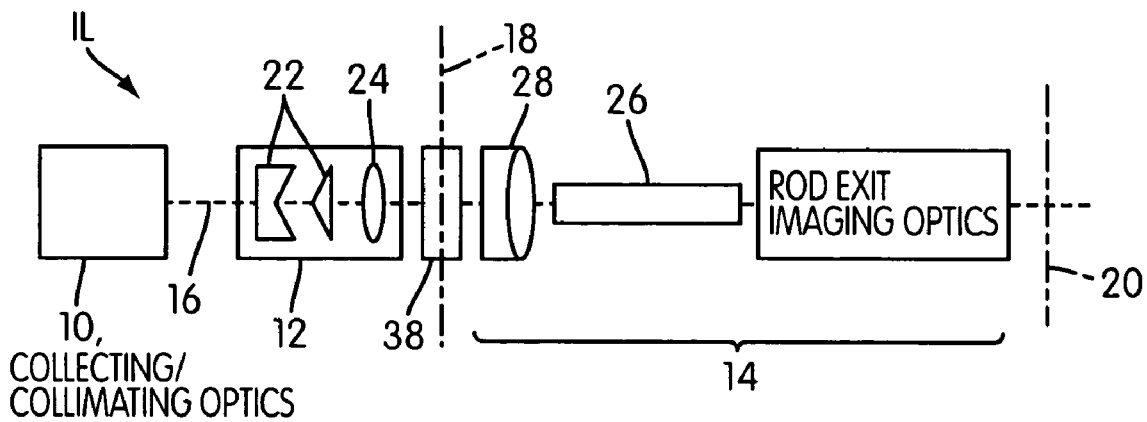
FIG. 9 is a schematic illustration of an illumination system for use in the invention.

Referring to FIG. 9, the illumination system IL includes light collecting/collimating optics 10; an axicon/zoom module 12; a multipole mode generating element 38; and light integrating and projecting optics 14. The components lie along optical axis 16 and are used to illuminate the mask MA located at a mask plane 20 which then produces an exposure pattern in resist on the wafer W via the projection system or lens PL. The illumination system IL illustrated in FIG. 9 includes a quartz rod light integrator 26. FIG. 9 shows the multipole mode generating element 38 located between the axicon/zoom module 12 and the integrating/projecting optics 14 at the pupil plane 18 of the system. It should be appreciated that the element 38 may be located elsewhere in the illumination system IL, for example before the axicon/zoom module 12, interposable within the axicon/zoom module 12, or at the entrance window of the rod 26. The location is related to the particular multipole mode generating element 38 that is being used. The optical axis 16 shown in FIG. 9 can of course be folded to produce a more compact illumination system.

Figure 10A:
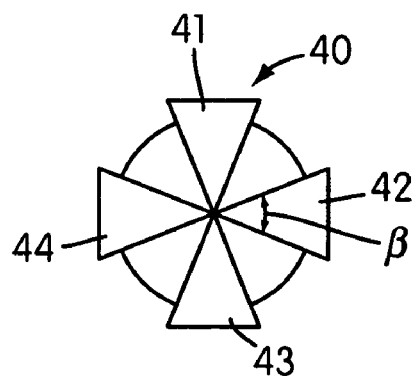
FIG. 10a is a schematic illustration of a multipole mode generating element of the illumination system of FIG. 9.
Figure 10B:
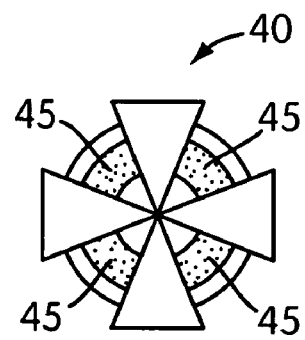
Figure 11:
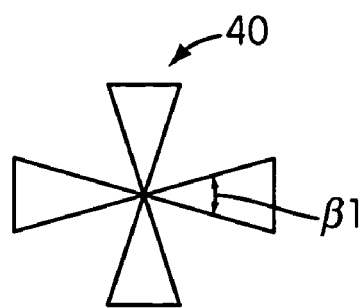
FIG. 11 is a schematic illustration of a multipole mode generating element according to another exemplary embodiment of the invention.

An exemplary embodiment of the multipole mode generating element 38 is shown in FIG. 10a. The element 38 has four triangular blades 41, 42, 43, 44 insertable into the beam path at the pupil plane 18 and which form a Maltese cross 40, which is also referred to herein as a Maltese aperture blade (MAB). Each blade has an apex angle β. FIG. 10b shows the illumination intensity distribution resulting from the combination of an annular illumination mode produced by the axicon/zoom module 12 and the MAB 40. The distribution has four light beams or poles 45. This embodiment enables continuously variable quadrupole illumination modes to be produced. The radial position of each pole 45 can be varied by adjusting the axicon optics 22, the radial width of each pole can be varied by adjusting the zoom lens 24, and the tangential pole width can be changed by inserting another set of blades having a different apex angle β1, such as Maltese cross 40 shown in FIG. 11. By removing the blades altogether, the illumination system can be used for conventional and/or annular modes, again with continuous variation.

Figure 12:
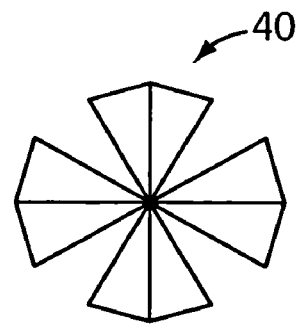
FIG. 12 is a schematic illustration of a multipole mode generating element according to still another exemplary embodiment of the invention.

Interposing blades of a different apex angle permits the tangential pole width to be changed in discrete steps. According to another embodiment of the present invention, the tangential pole width can be continuously varied by each arm of the Maltese cross comprising a stack of n blades, rotatable with respect to each other about the optical axis of the system where their vertices lie. If the angle of each separate blade is β the overall segment angle can be continuously varied from β to nβ, thus the tangential width of each pole can be varied between the angles $\pi/2-\beta$ and $\pi/2-n\beta$. The rotation of the blades to vary the effective width of each arm of the Maltese cross can be automated. An exemplary embodiment is shown in FIG. 12 in which each stack consists of two blades. FIG. 12 shows the blades of each stack spread out. When the blades are aligned, the Maltese cross 40 will look the same as that shown in FIG. 11. Another variation is to have blades rotatable about radial axes to permit their effective width to be varied, for example two blades hinged in the form of a butterfly.

According to a further embodiment, just two blades are used as the multipole mode generating element 38 in an optical system which includes a light pipe, such as a rectangular quartz rod 26, as shown in the illumination system of FIG. 9. One of the blades is oriented parallel to the short side of the rectangular cross-section of the light pipe 26 and the other blade parallel to the long side. Due to the multiple reflections in the pipe 26, the resulting illumination mode is a mixture of annular and quadrupole. The two-blade system can produce an illumination mode including a quadruple component with lower energy-loss than the Maltese cross arrangement, as there are fewer blades obstructing the light beam. In one example the blades are triangular and are like two perpendicular arms of a Maltese cross, e.g. blades 41 and 42 shown in FIG. 10a. One or both of the blades in this embodiment can be a composite blade comprising a stack of smaller rotatable blades as described above.

Typically the blades are positioned along directions corresponding to orthogonal lines on the mask MA, so that the light poles 45 are located in each quadrant with centers 45° from the orthogonal lines. This orientation can produce optimal projection of the lines, particularly for dense structures, such as for DRAM-like structures. The orthogonal lines are generally referred to as horizontal and vertical.

A further variation on the above embodiments using blades is to make all the blades rotatable about the optical axis 16 of the illumination system so that the position of the poles can be rotated.

Figure 13:
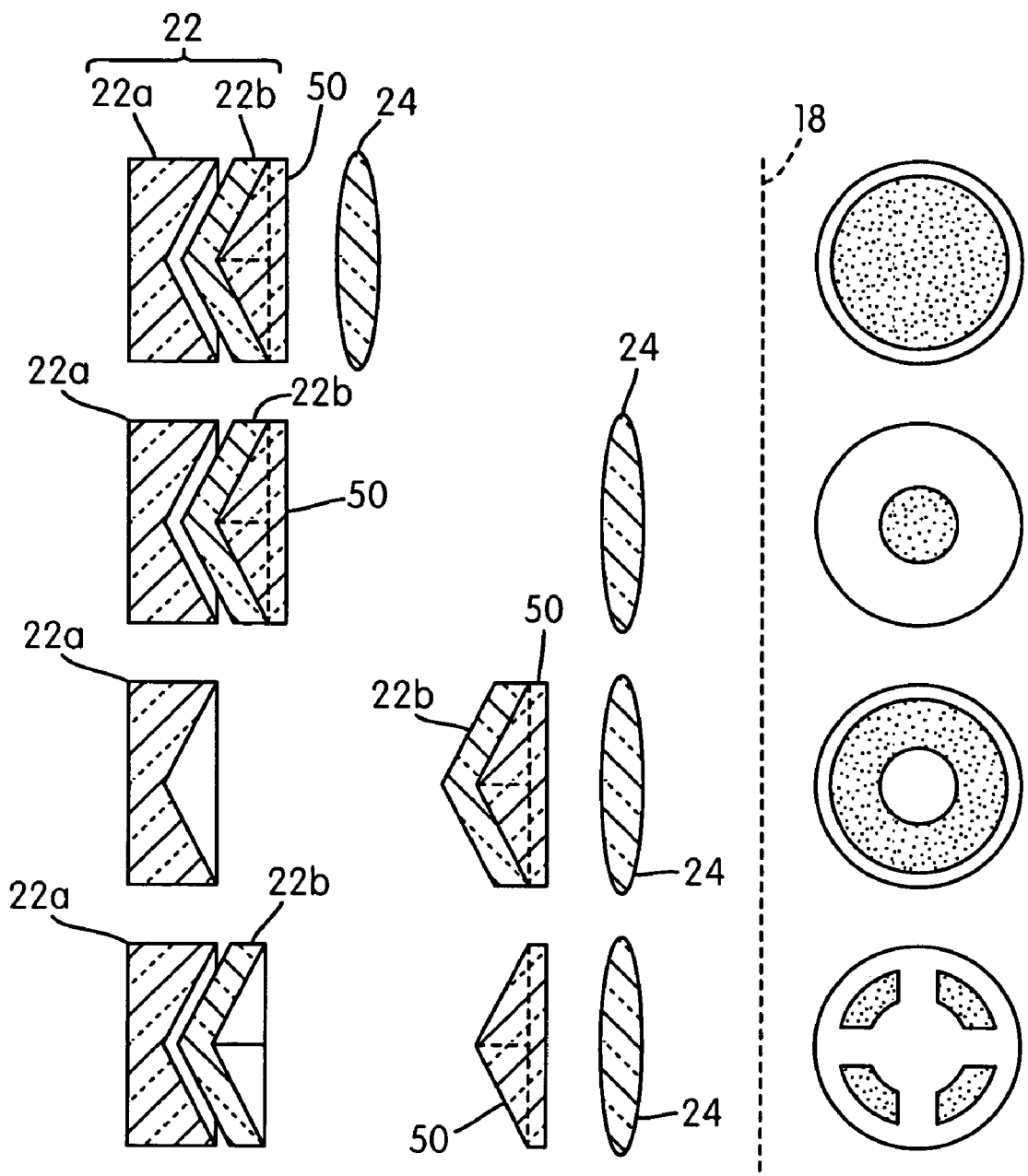
FIG. 13 is a schematic cross section illustration of an illumination system for use in the invention and the resulting illumination arrangements obtainable therewith.

Referring to FIG. 13, another exemplary embodiment of the present invention includes the axicon/zoom module with a pyramidal prism 50 as the multipole mode generating element. This also enables conventional, annular and quadrupole illumination to be produced with continuous variations of the modes. FIG. 13 shows the optical components of an axicon/zoom module. The right hand column in FIG. 13 shows the illumination intensity distributions at the pupil plane 18 for various positions of the axicon pair 22a, 22b and zoom lens 24. The axicon pair 22 comprises a pair of elements having conical surfaces, one concave 22a, one convex 22b, to produce circular and annular illumination patterns. The fourth row shows the effect of separating the pyramid-shaped prism 50 from convex element 22b. The side of the convex element 22b facing the pyramid 50 is concave pyramidal for receiving the pyramid 50. The convex element 22b and pyramid 50 comprise a second axicon also known as a pyramidal axicon or pyramidon. The pyramid-shaped prism 50 has a four-sided base, which consequently produces quadrupole mode illumination patterns, such as the four spots illustrated at the bottom in the right hand column in FIG. 13.

The axicon/zoom module of FIG. 13 allows the illumination mode to be varied continuously from conventional to annular or quadrupole. The zoom lens 24 sets the spot size or partial coherence factor, the axicon pair 22 determines the annularity, and the pyramid 50 determines the quadrupolarity. In addition, since light flux is redistributed rather than blocked, there is virtually no light loss, so that a high throughout can be maintained.

Although in the illustrated examples the illumination radiation passes through the axicon pair 22 before the zoom lens 24, the sequence of these elements can be changed depending on the radiation source that is used.

Figure 14:
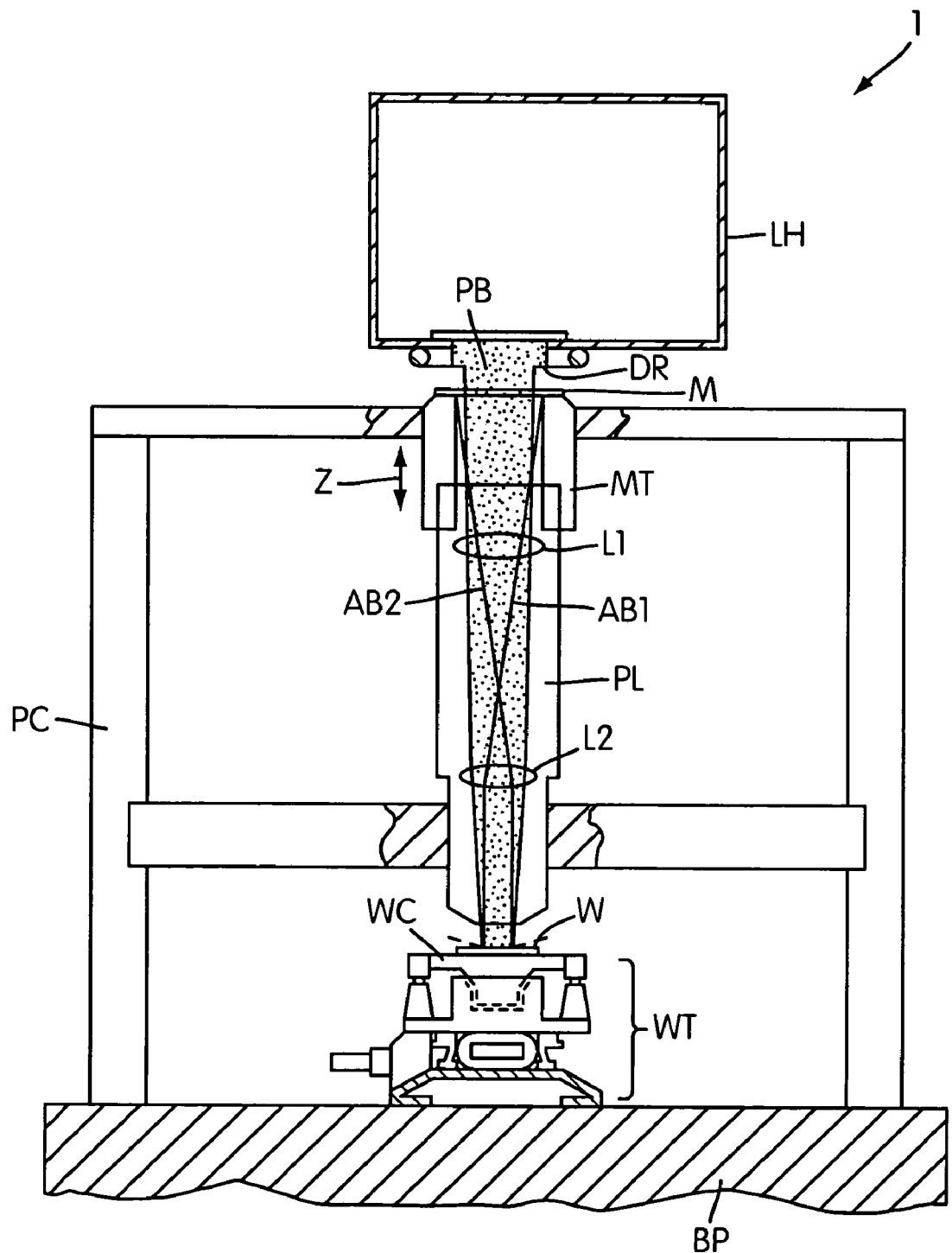
FIG. 14 is a schematic illustration of an apparatus constructed and arranged to image a mask on a substrate.

With reference to FIG. 14, an illumination system IL as described above can be used to repetitively image the mask M on the substrate W. The lithographic apparatus shown is transmissive; however, it may also be reflective or catadioptric, for example.

Figure 26:
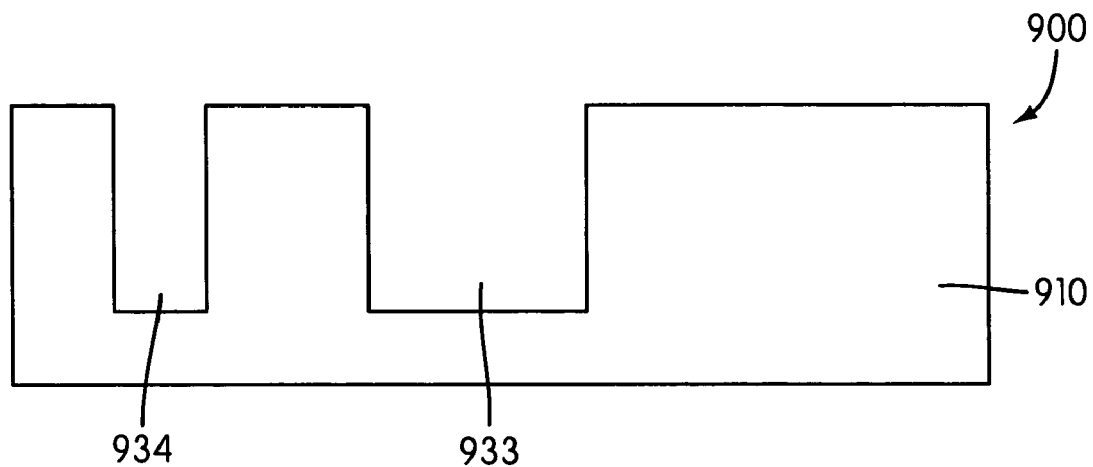
FIG. 26 is a schematic illustration of a device manufactured according to the method of claim 25.

The lithographic apparatus 1 includes an illumination housing LH containing a radiation source and an illumination system according to the present invention constructed and arranged to supply the projection beam PB. The projection beam PB passes through a diaphragm DR and is subsequently incident on the mask M which is arranged on the mask table MT, which is adjustable in position. The mask table MT forms part of a projection column PC incorporating the projection system or lens PL which includes a plurality of lens elements, only two of which, L1 and L2, are shown in FIG. 26. The projection system or lens PL images the mask M onto the substrate W which is provided with a photoresist layer. The substrate W is provided on a substrate support WC which forms part of the substrate table WT on, for example, air bearings. The projection system or lens PL has, for example a magnification M=¼, a numerical aperture NA>0.7. The substrate table WT is supported, for example by a granite base plate BP which closes the projection column PC at its lower side.

The substrate can be displaced in the X, Y and Z directions and rotated, for example about the Z axis with the aid of the substrate table WT. These adjustments are controlled by various servosystems such as a focus servosystem, for example an X, Y, Φz interferometer system cooperating with the substrate support, and an alignment system with which mask marks can be aligned with respect to substrate marks. These servosystems are not shown in FIG. 14. Only the alignment beams AB1, AB2 of the alignment system are shown.

The mask MA must be imaged a number of times, in accordance with the number of IC's to be formed on the substrate W, each time on a different target area C of the substrate W.

Figure 15:
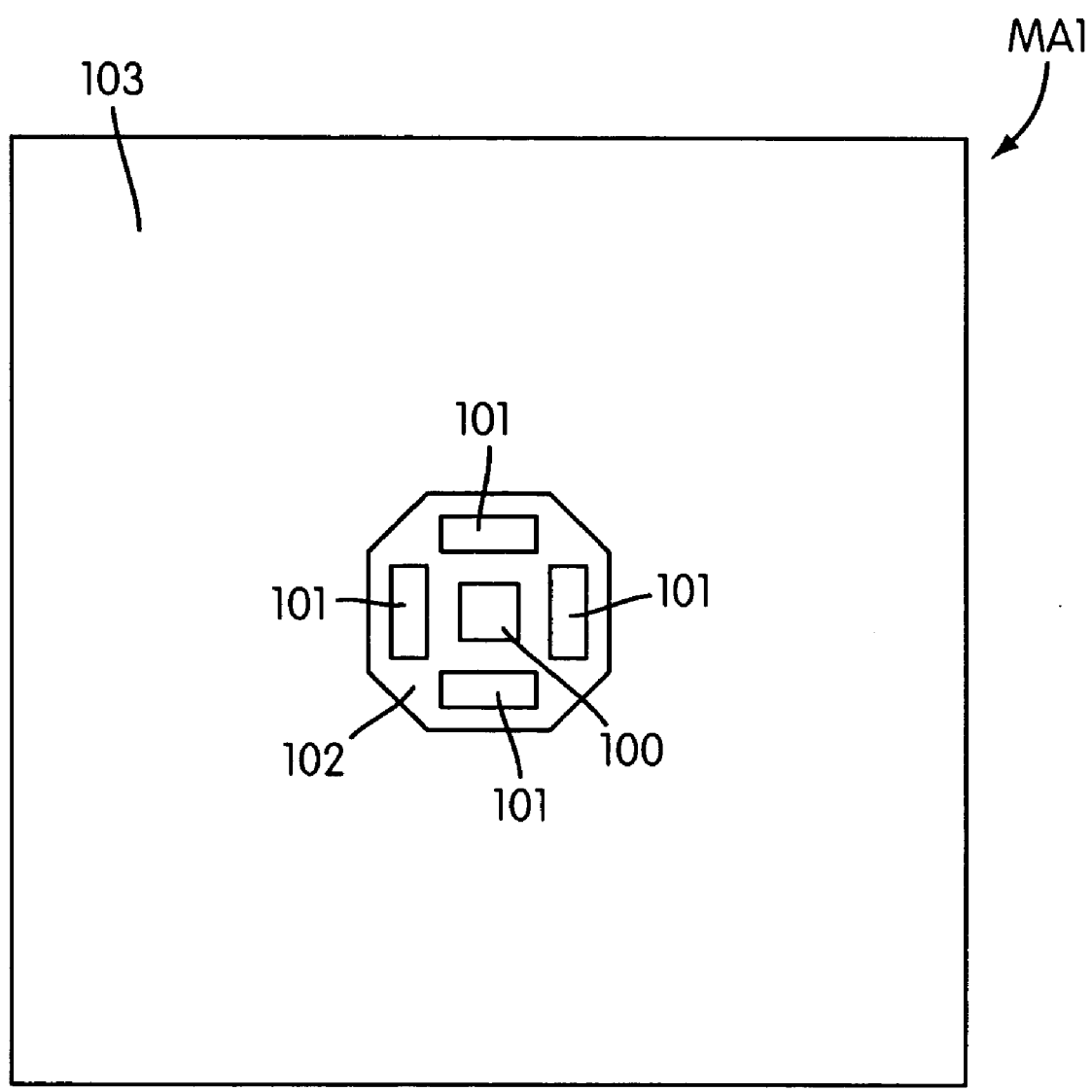
FIG. 15 is a schematic illustration of a patterning device according to an exemplary embodiment of the present invention.

Referring to FIG. 15, an exemplary embodiment of a mask MA1 according to the present invention includes a feature 100 to be imaged. In this exemplary embodiment, the feature 100 to be imaged is a hole, for example a 100 nm hole. Assist features 101 are formed in the mask in proximity to the feature 100 to improve resistance to process variations and add intensity to the feature 100. A phase shifted area 102 that is phase shifted, for example, 180° from the feature 100 and the assist features 101 is provided to reduce diffraction effects, increase contrast and improve resolution. The mask MA1 further includes an opaque area 103 formed of, for example, chromium.

Figure 16:
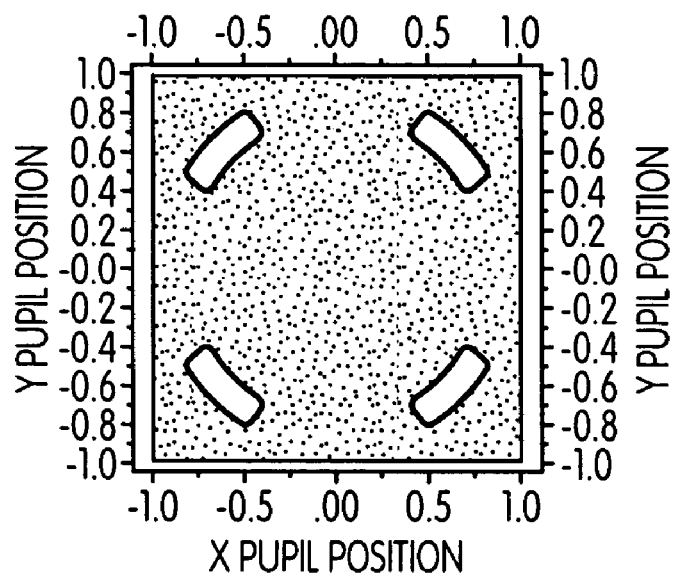
FIG. 16 is a schematic illustration of an illumination intensity distribution or arrangement according to an exemplary embodiment of the invention.
Figure 17:
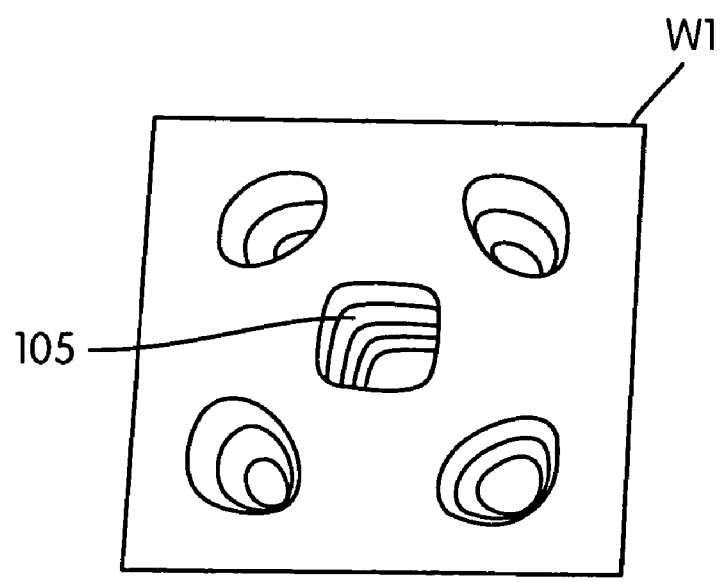
FIG. 17 is a schematic illustration of a profile of a pattern in a substrate produced by the patterning device of FIG. 15 and the illumination arrangement of FIG. 16.
Figure 18:
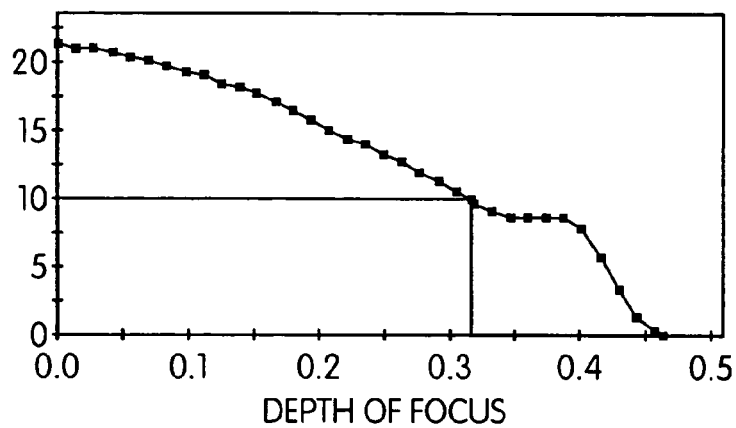
FIG. 18 is a schematic illustration of a process latitude of a process using the illumination arrangement of FIG. 16, the patterning device of FIG. 15 for producing the profile of FIG. 17.

Referring to FIGS. 16 and 17, an illumination intensity distribution or arrangement capable of forming a hole 105 in a substrate W1 corresponding to the feature 100 of the mask MA1 is shown. The illumination intensity distribution may be, for example, a 0.95/0.8 30° quasar arrangement. The numbers 0.95, 0.8, and 30° refer to the pole radii $v_o$ and $\sigma_i$ and the pole angle, respectively The lithographic apparatus has a numerical aperture NA=0.85. FIG. 17 illustrates a calculated profile of the hole 105 formed in the resist on the substrate W1 using the mask MA1 of FIG. 15. As shown in FIG. 17, the assist features print into the resist, but it should be appreciated that the mask feature sizes and the dose may be adjusted so that only the hole 105 prints into the resist. FIG. 18 illustrates the simulated process latitude, exposure latitude versus depth of focus, for the illuminator arrangement of FIG. 16 as applied to the mask MA1 of FIG. 15, assuming a 20 nm mask bias and a modern photoresist model. Although the illumination arrangement shown is quasar, it should be appreciated that the illumination arrangement is dependent on the particular pattern to be imaged and may be another arrangement.

Figure 19:
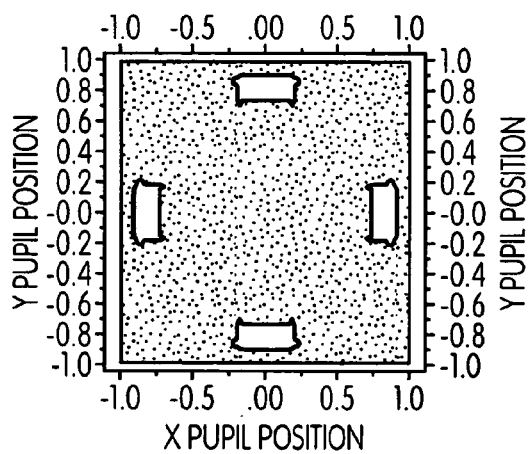
FIG. 19 is a schematic illustration of an illumination arrangement for printing a negative image of the pattern of the patterning device of FIG. 15.
Figure 20:
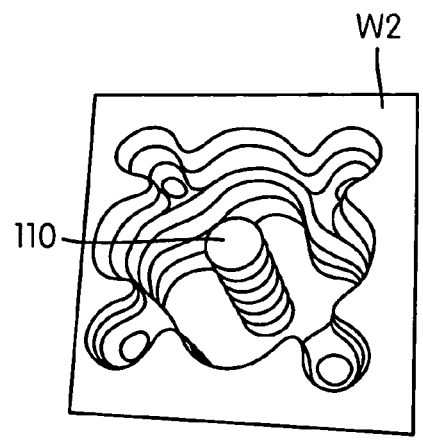
FIG. 20 is a schematic illustration of a profile of a pattern in a substrate produced by the patterning device of FIG. 15 and the illumination arrangement of FIG. 19.
Figure 21:
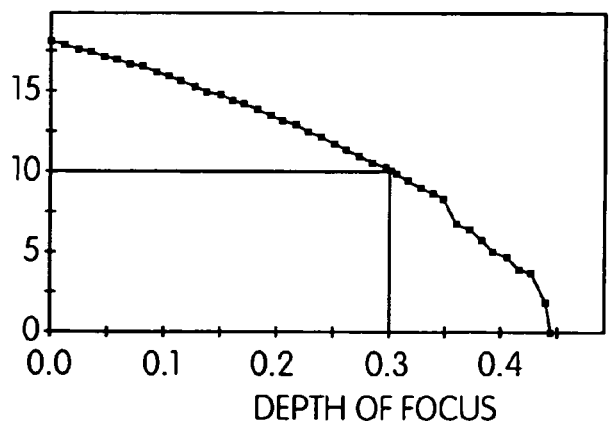
FIG. 21 is a schematic illustration of a process latitude of a process using the illumination arrangement of FIG. 19, the patterning device of FIG. 15 for producing the profile of FIG. 20.

It is possible to use the mask MA1 of FIG. 15 to print a negative image of the profile shown in FIG. 17. By rotating the poles of the illuminator arrangement shown in FIG. 16 by 45° to the illuminator arrangement shown in FIG. 19, a calculated profile as shown in FIG. 20 may be formed in the resist on the substrate W2. As shown in FIG. 20, an inverse contact or post 110 is formed instead of a hole. Referring to FIG. 19, the illuminator arrangement to produce the post 110 is shown. The illumination intensity distribution may be, for example, a 0.92/0.72 30° C.-quad arrangement. As in the embodiment discussed above which forms a hole, the lithographic apparatus in this embodiment to form a post has a numerical aperture NA=0.85. FIG. 21 illustrates the simulated process latitude for the illuminator arrangement of FIG. 19 as applied to the mask MA1 of FIG. 15, assuming a 20 nm mask bias and a modern photoresist model. Although the exemplary illumination intensity distributions are quasar, it should be appreciated that the illumination arrangement is dependent on the particular pattern to be imaged and may be another arrangement as discussed above. It should also be appreciated that rotation of the illumination intensity distribution may include varying the radii and angle of the poles to produce the negative image within an acceptable process latitude. For example, similar results to the image tone reversal by 45° rotation of the four-fold symmetric mask shown in FIG. 15 may be obtained by 90° rotation of dipole illumination and a two-fold symmetrical mask, 60° rotation of tripole illumination and a three-fold symmetric mask or by 30° rotation of hexapole illumination and a six-fold symmetric mask, etc. In general, a reverse image of an n-fold symmetrical mask may be obtained by rotating an illumination arrangement having n poles by an angle of 360°/2n, where n is an integer greater than 1.

The present invention thus allows tone reversal of a pattern formed on a mask by rotating the poles of the illumination arrangement used to image the mask pattern.

As discussed above, the poles of an illumination arrangement may be rotated by rotating the blades shown in FIGS. 10a-12. It is thus unnecessary to use negative resist or perform conventional chemical image tone reversal processes. The present invention may be used to improve the alignment of holes and posts in successive levels using the same mask to form both the holes and posts. The present invention would provide shorter wafer processing times, increase throughput, reduce costs, and provide superior alignment.

Figure 2:
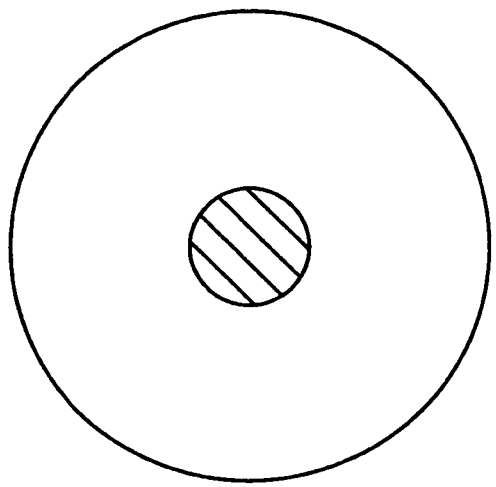
FIG. 2 is a schematic illustration of a small, or low, sigma illumination arrangement.
Figure 3:
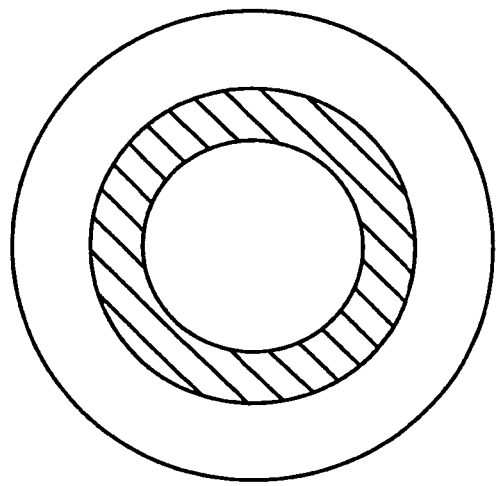
FIG. 3 is a schematic illustration of an annular off-axis illumination arrangement.
Figure 4:
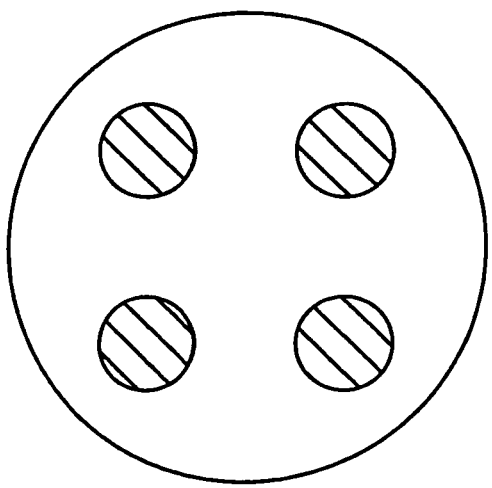
FIG. 4 is a schematic illustration of an off-axis quadrupole illumination arrangement.
Figure 5:
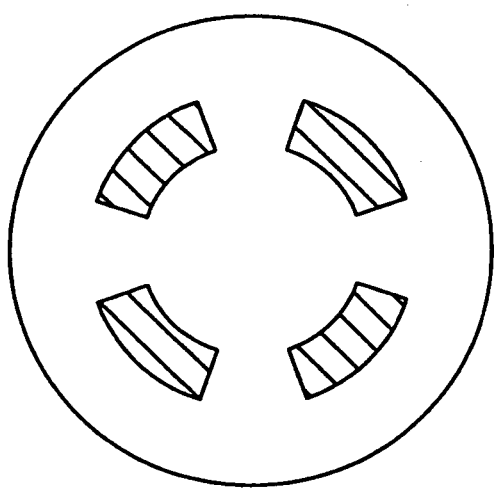
FIG. 5 is a schematic illustration of an off-axis quasar illumination arrangement.
Figure 6:
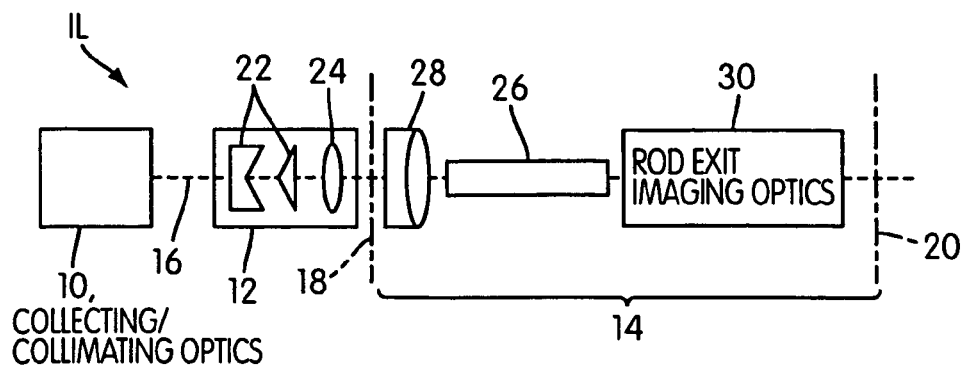
FIG. 6 is a schematic illustration of a known illumination system.
Figure 7:
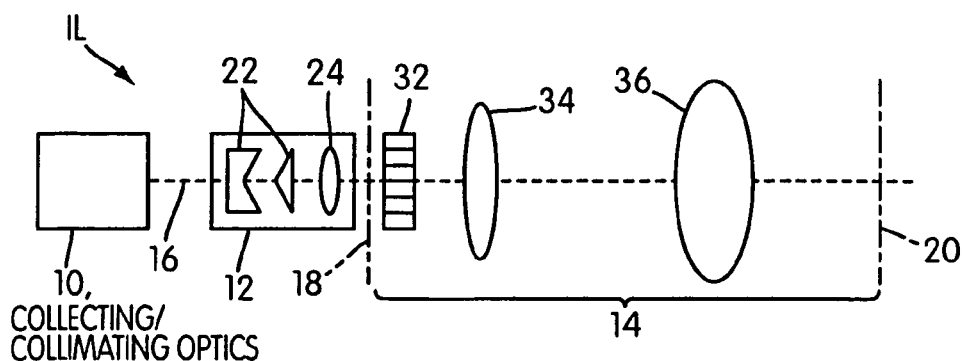
FIG. 7 is a schematic illustration of another known illumination system.
Figure 8:
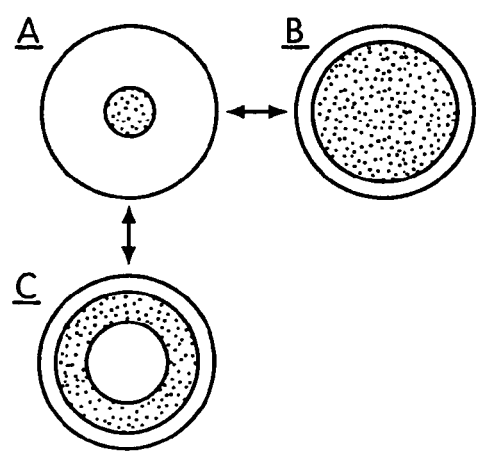
FIG. 8 is a schematic illustration of illumination arrangements obtainable with the illumination systems of FIGS. 6 and 7.
Figure 22:
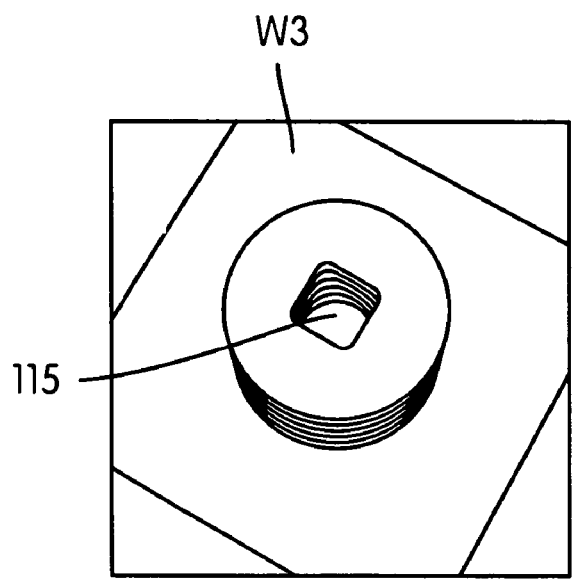
FIG. 22 is a schematic illustration of a method of image tone reversal according to an exemplary embodiment of the present invention.
Figure 23:
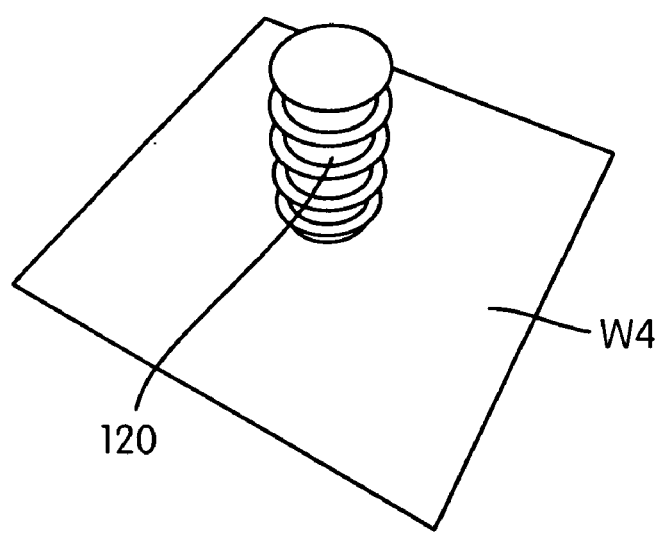
FIG. 23 is a schematic illustration of manufacturing a device according to an exemplary embodiment of the present invention.

Referring to FIGS. 22 and 23, another exemplary method of image tone reversal will be described. FIG. 22 illustrates a calculated profile of a hole 115 formed in a substrate W3 using a 25% attenuating phase shift mask that includes a 120 nm isolated hole and a 0.3 small sigma conventional illumination arrangement similar to that shown in FIG. 2. Referring to FIG. 23, the calculated profile of a post 120, that is the reverse of the hole 115, can be formed in the substrate W4 by using the same mask used to form the hole 115 and a 0.92/0.72 annular illumination arrangement similar to that shown in FIG. 3. In general, posts which are the reverse image of holes, formed by relatively low sigma conventional illumination, may be formed by the use of relatively high sigma, relatively narrow width annular illumination arrangements. The present invention thus allows tone reversal of a pattern formed on a mask by "source inversion."

Figure 24:
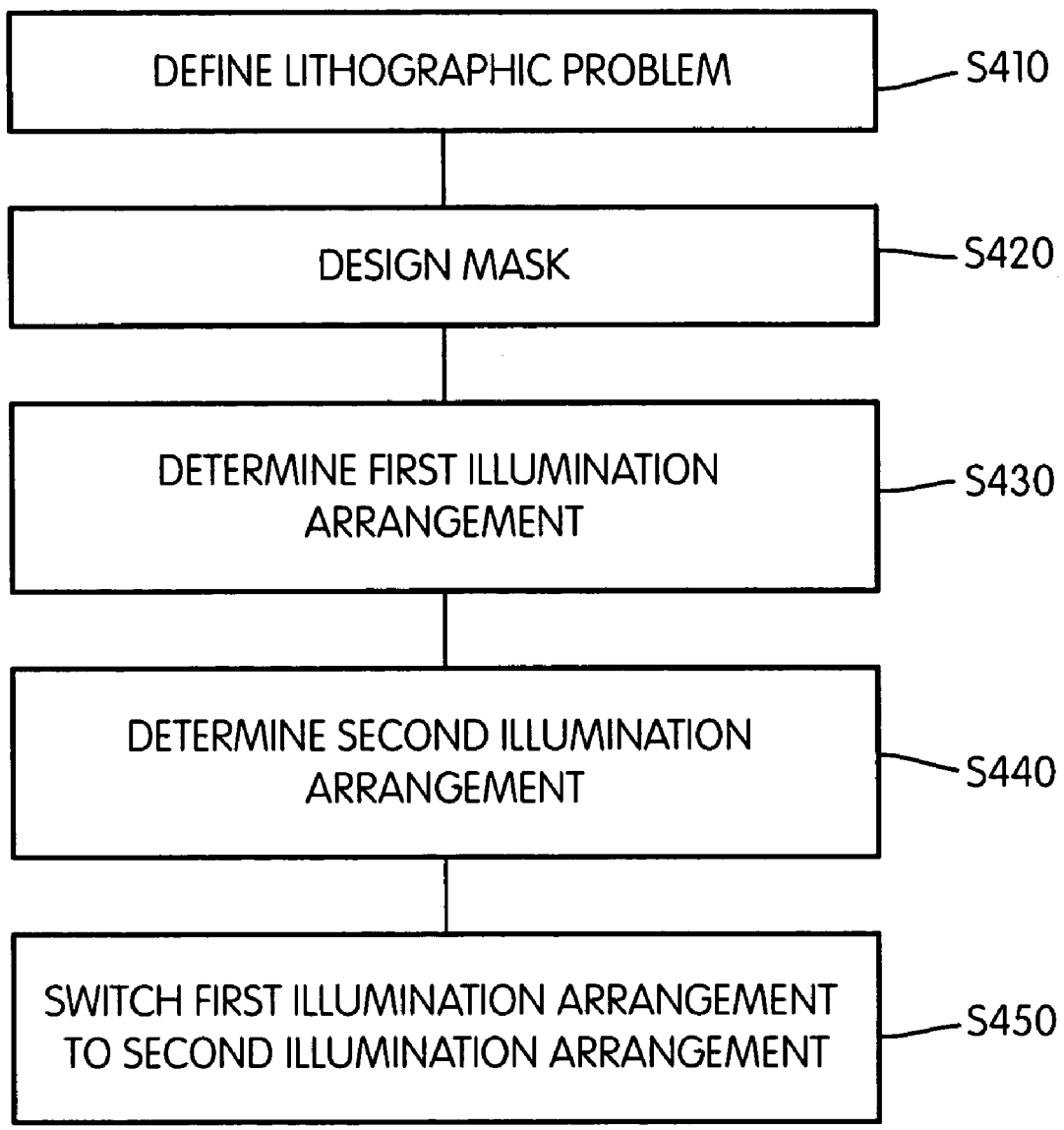
FIG. 24 is a schematic illustration of a device manufactured according to the method of FIG. 23.

Referring to FIG. 24, an exemplary embodiment of a method of image tone reversal according to the present invention includes defining a lithographic problem S410. The lithographic problem that is defined may include the designing of a device that includes features that are to be negatively printed. The lithographic problem may also include alignment of holes and posts in successive patterned layers of a wafer using a similar mask pattern or even the same mask for the formation of the holes and posts. The lithographic problem may still further include the printing of an array of holes and posts. The method then proceeds to S420 where a mask including a pattern, the pattern including at least a portion that is to be positively and negatively imaged, is designed. In S430, a first illumination arrangement capable of positively imaging the portion is determined. As discussed above, the first illumination arrangement for positively imaging the portion of the mask is dependent on the features contained in the portion and may be a multipole arrangement or a small sigma arrangement. The method then proceeds to S440 where a second illumination arrangement capable of negatively imaging the portion is determined. As discussed above, the second illumination arrangement for negatively imaging the portion of the mask may include a multipole arrangement or an annular arrangement. In S450, the illumination arrangement is modified from the first illumination arrangement to the second illumination arrangement. As discussed above, modifying the illumination arrangement may include rotating the poles of a multipole illumination arrangement or an "inversion" of a small sigma illumination arrangement to an annular illumination arrangement. It should be appreciated that other activity may occur prior to, during, or after the method described above. For example, the method may or may not include positively imaging the mask, or just the portion, to form a first layer and then realigning the mask, modifying the illumination arrangement and negatively imaging the mask, or the portion of the mask, and negatively imaging to form a second layer, so that, for example, holes in the first layer are aligned with posts in the second layer.

Figure 25:
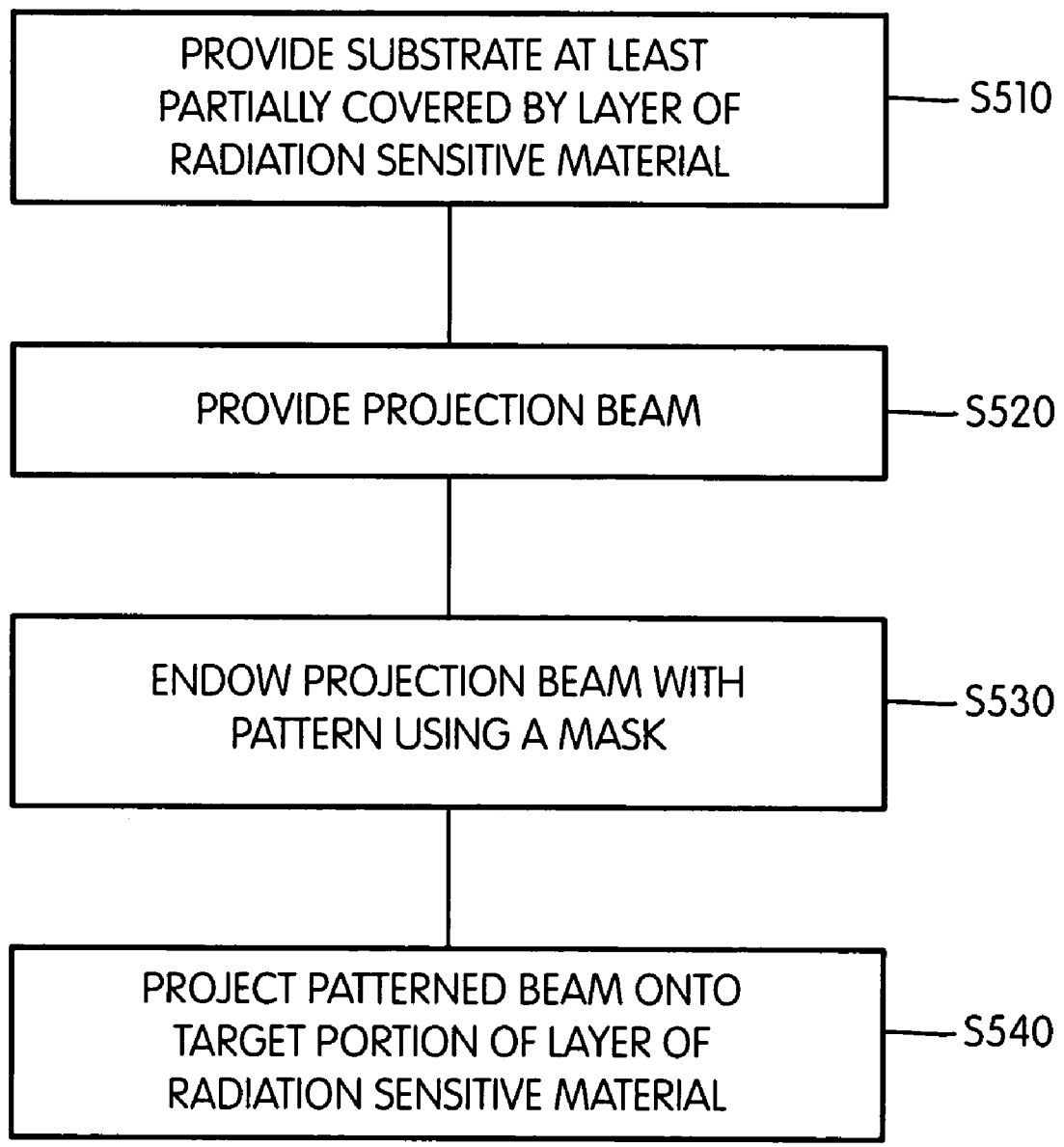
FIG. 25 is schematic illustration of an exemplary method of manufacturing a device.

Referring to FIG. 25, a method of manufacturing a device for use in an integrated circuit, an integrated optical system, a magnetic domain memory, a liquid-crystal display panel, a thin film magnetic head, a printed wiring board or a nanomagnet fabrication includes providing a substrate that is at least partially covered by a layer of radiation sensitive material S510, providing a projection beam of radiation using a radiation system S520, endowing the projection beam with a pattern in its cross section using a mask S530, and projecting the patterned beam of radiation onto a target portion of the layer of radiation sensitive material S540. It will be appreciated by those of ordinary skill in the art that the method of FIG. 23 may be preceded by design of the functions and performance of the device and a pattern to realize the functions. It will also be appreciated that the design and manufacture of a mask according to the present invention may also precede the method shown in FIG. 25. It will also be appreciated that substrate, or wafer, production and processing may precede the method shown in FIG. 25. The wafer processing may include, for example, oxidizing the wafer surface, forming an insulation film on the wafer surface, forming an electrode, such as by vacuum deposition, on the wafer, implanting ions into the wafer, and doping the wafer with a photosensitive agent. Other wafer processing steps that may follow the method shown in FIG. 25 include developing the resist, removing the developed resist, such as by etching, and removing unnecessary resist after etching. It will also be appreciated that device assembly and inspection, including, for example, dicing, bonding, packaging (chip sealing), and operation and durability check testing, may follow the method shown in FIG. 24.

Referring to FIG. 26, a device 900 manufactured by an exemplary method according to the present invention includes a substrate 910 having a pattern including holes 933, 934 formed therein. As discussed above, it should be appreciated that the device 900 may be formed in the manufacture of integrated circuits, integrated optical systems, magnetic domain memories, liquid-crystal display panels, thin-film magnetic heads, or nanomagnets. It should also be appreciated that the device 900 may include a plurality of patterned layers that may be formed by repeating the method or a variant thereof.

Figure 27:
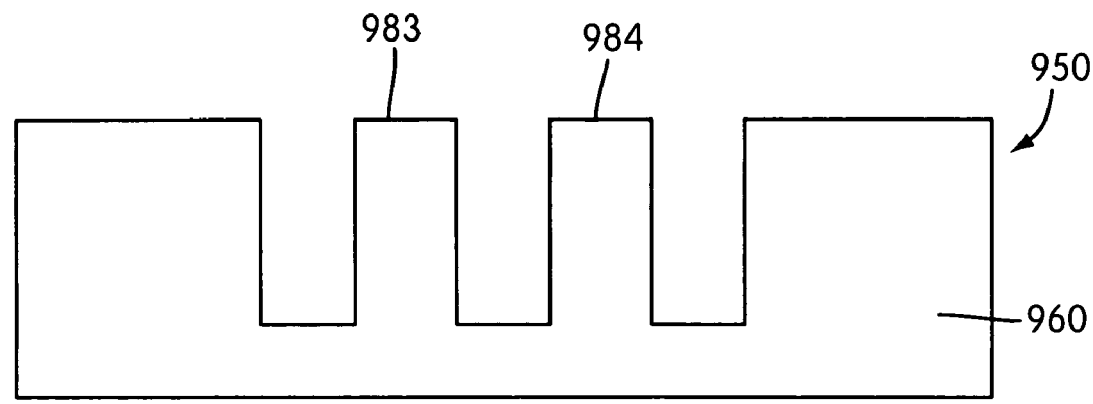
FIG. 27 is a schematic illustration of a device according to another exemplary embodiment of the invention.
Figure 28:
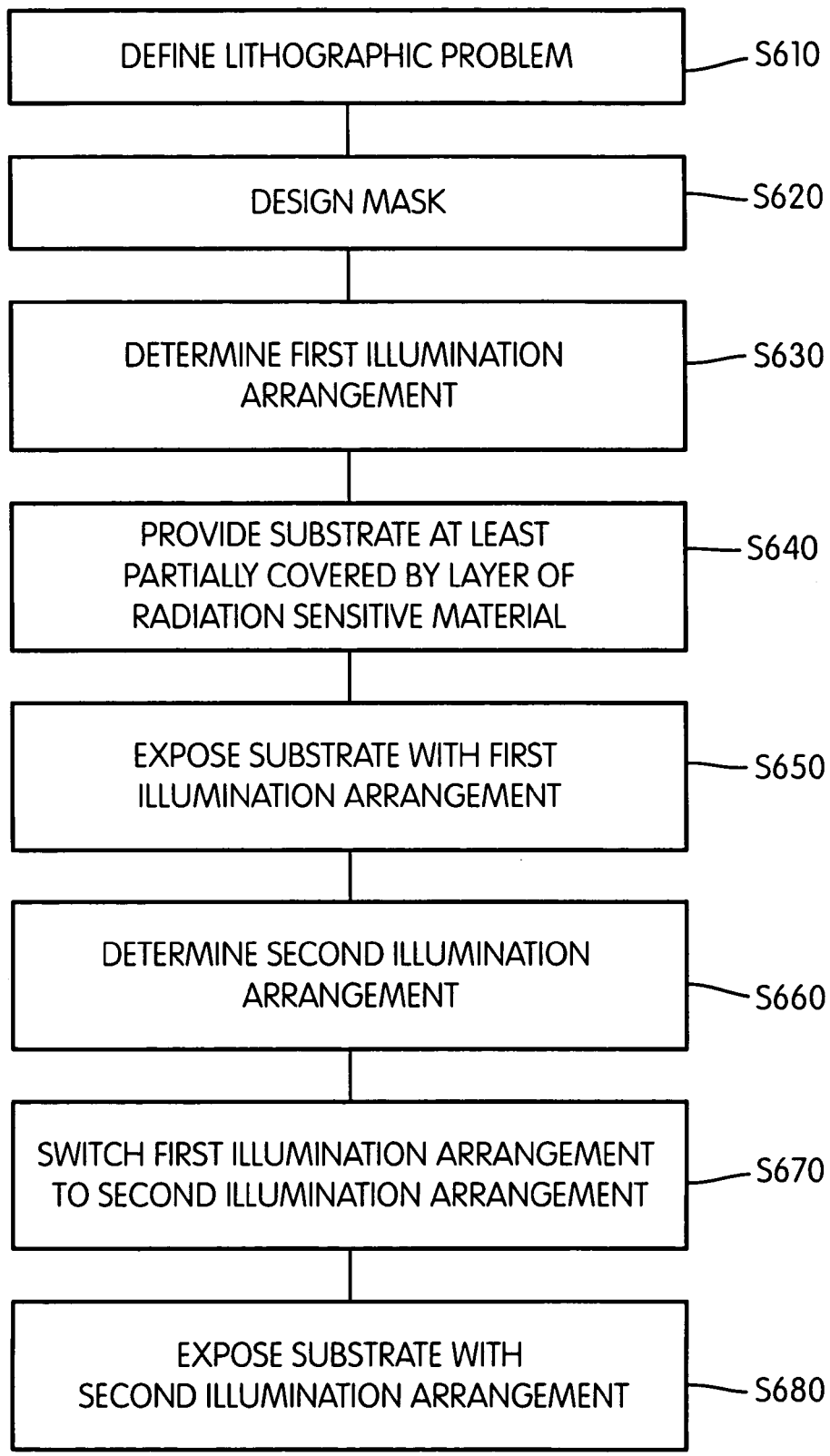
FIG. 28 is a schematic illustration of an exemplary method of manufacturing the device of FIG. 27.

Referring to FIG. 27, a device 950 manufactured by an exemplary method according to the present invention includes a substrate 960 having a pattern including posts 983, 984 formed therein. The device may be formed by a method shown in FIG. 28. Referring to FIG. 28, the method begins by defining a lithographic problem S610 in a manner similar to that discussed above with reference to FIG. 24. The method proceeds to S620 where a mask including a pattern, the pattern including at least a portion that is to be positively and negatively imaged, is designed. In S630, a first illumination arrangement capable of positively imaging the portion is determined. The method then proceeds to S640 where a substrate that is at least partially covered by a layer of radiation sensitive material is provided. In S650, a target portion of the substrate is exposed by a projection beam having the first illumination arrangement and endowed with the pattern of the mask. The method then proceeds to S660 where an illumination arrangement capable of negatively imaging the portion of the mask is determined. In S670, the illumination arrangement is modified from the first illumination arrangement to the second illumination arrangement. The method concludes in S680 where a target portion of the substrate is exposed by a projection beam having the second illumination arrangement and endowed with the pattern of the mask. It should be appreciated that the method described above may proceed in a manner other than as described. For example, the first and second illumination arrangements may be determined prior to any exposure of the substrate. It should also be appreciated that substrate, or wafer, production and processing may precede the method of FIG. 28, as discussed above with respect to FIG. 24, and other wafer processing steps and device assembly and inspection steps may follow the method of FIG. 28, as also discussed above with respect to FIG. 24.

For a particular lithographic problem or feature, using the exemplary methods of the present invention allows the feature to be printed with a mask of "opposite tone" than what would ordinarily be expected. For example, to print posts a mask including a chrome light blocking region and a positive resist would ordinarily be used to define the pattern. However, posts can be printed with a mask including an open region using the illuminator arrangement and mask designs of the present invention. Alternatively, according to the present invention, a negative resist could be selected to print holes from a mask including an open region, which ordinarily would require a mask including a chrome light blocking region. Thus, the present invention provides more choices in the design of masks, resist processes and illuminator arrangements for the printing of lithographic features.

While specific embodiments of the invention have been described above, it will be appreciated that the invention may be practiced otherwise than as described. The description is not intended to limit the invention.

What is claimed is:

1. A method of reversing a tone of an image to be printed in a layer of radiation sensitive material at least partially covering a substrate, the method comprising:
   defining a lithographic problem, the problem including a lithographic feature to be printed;
   designing a patterning device;
   determining a first illumination arrangement and a radiation sensitive material process capable of printing a positive tone of the lithographic feature, wherein determining the first illumination arrangement includes selecting a multipole illumination arrangement or selecting a small sigma illumination arrangement;
   determining a second illumination arrangement capable of printing a negative tone of the lithographic feature with the radiation sensitive material process, wherein determining the second illumination arrangement includes rotating poles of the first illumination arrangement or changing the small sigma illumination arrangement to an annular illumination arrangement; and
   performing an exposure of the substrate with the second illumination arrangement.

2. A method according to claim 1, wherein determining the second illumination arrangement further includes modifying radii and angle of poles of the first illumination arrangement.

3. A method according to claim 1, wherein designing the patterning device includes designing assist features, or a phase shifting region, or both assist features and a phase shifting region, of the patterning device.

4. A device for use in integrated circuits, integrated optical systems, patterns for magnetic domain memories, liquid-crystal display panels, thin-film magnetic heads, printed wiring boards, or nanomagnet fabrications, the device manufactured by a method comprising:
   defining a lithographic problem, the problem including a lithographic feature to be printed;
   designing a patterning device;
   providing a substrate at least partially covered by a layer of radiation sensitive material;
   determining a first illumination arrangement and a radiation sensitive material process capable of printing a positive tone of the lithographic feature, wherein determining the first illumination arrangement includes selecting a multipole illumination arrangement or selecting a small sigma illumination arrangement;
   determining a second illumination arrangement capable of printing a negative tone of the lithographic feature with the radiation sensitive material process, wherein determining the second illumination arrangement includes rotating poles of the first illumination arrangement or changing the small sigma illumination arrangement to an annular illumination arrangement; and
   projecting a radiation beam, having the first or second illumination arrangement and endowed with a pattern in its cross section by the patterning device, onto a target portion of the layer of radiation sensitive material.

5. A device according to claim 4, wherein determining the second illumination arrangement further includes modifying radii and angle of poles of the first illumination arrangement.

6. A device according to claim 4, wherein designing the patterning device includes designing assist features, or a phase shifting region, or both assist features and a phase shifting region, of the patterning device.

7. A method of reversing a tone of an image to be printed in a layer of radiation sensitive material at least partially covering a substrate using an illumination arrangement generated by an illumination system including a plurality of optical elements along an optical axis, the method comprising:
   defining a lithographic problem, the problem including a lithographic feature to be printed;
   designing a patterning device;
   determining a first illumination arrangement and a radiation sensitive material process capable of printing a positive tone of the lithographic feature, wherein determining the first illumination arrangement includes selecting a multi-pole illumination arrangement or selecting a small sigma illumination arrangement; and
   determining a second illumination arrangement capable of printing the lithographic feature with the radiation sensitive material process, wherein determining the second illumination arrangement includes rotating poles of the first illumination arrangement or changing the small sigma illumination arrangement to an annular illumination arrangement.

8. A method according to claim 7, wherein determining the second illumination arrangement further includes modifying radii and angle of poles of the first illumination arrangement.

9. A method according to claim 7, wherein designing the patterning device includes designing assist features, or a phase shifting region, or both assist features and a phase shifting region, of the patterning device.

10. A lithographic projection apparatus, comprising:
    an illumination system configured to provide a beam of radiation;
    a support configured to support a patterning device, the patterning device configured to endow the beam of radiation with a pattern in its cross section to form a patterned beam of radiation;
    a substrate table configured to hold a substrate at least partially covered with a layer of radiation sensitive material; and
    a projection system configured to project the patterned beam of radiation onto a target portion of the substrate, wherein the illumination system is configured to print a lithographic feature defined by the patterning device in a positive tone using a first illumination arrangement and a radiation sensitive material process, wherein the first illumination arrangement includes a multipole illumination arrangement or a small sigma illumination arrangement, and to print the lithographic feature in a negative tone using a second illumination arrangement with the radiation sensitive material process. wherein the second illumination arrangement includes poles of the first illumination arrangement being rotated or an annular illumination arrangement.

11. An apparatus according to claim 10, wherein the second illumination arrangement further includes modified radii and angle of poles of the first illumination arrangement.

12. An apparatus according to claim 10, wherein the patterning device is a mask and includes assist features, or a phase shifting region, or both assist features and a phase shifting region.

* * * * *